United States Patent
Wu et al.

(10) Patent No.: US 11,562,779 B2
(45) Date of Patent: *Jan. 24, 2023

(54) BIT LINE SECONDARY DRIVE CIRCUIT AND METHOD

(71) Applicant: TAIWAN SEMICONDUCTOR MANUFACTURING COMPANY, LTD., Hsinchu (TW)

(72) Inventors: Shang-Chi Wu, Hsinchu (TW); Yangsyu Lin, Hsinchu (TW); Chiting Cheng, Hsinchu (TW); Jonathan Tsung-Yung Chang, Hsinchu (TW); Mahmut Sinangil, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/109,964

(22) Filed: Dec. 2, 2020

(65) Prior Publication Data
US 2021/0090621 A1 Mar. 25, 2021

Related U.S. Application Data

(63) Continuation of application No. 15/938,393, filed on Mar. 28, 2018, now Pat. No. 10,867,646.

(51) Int. Cl.
*G11C 7/12* (2006.01)
*G11C 11/413* (2006.01)
(Continued)

(52) U.S. Cl.
CPC ............. *G11C 7/12* (2013.01); *G11C 11/413* (2013.01); *G11C 11/4074* (2013.01);
(Continued)

(58) Field of Classification Search
CPC ...... G11C 7/12; G11C 11/419; G11C 11/4074
See application file for complete search history.

(56) References Cited

U.S. PATENT DOCUMENTS

| 4,932,002 A | 6/1990 | Houston |
| 5,410,506 A | 4/1995 | Ferrant et al. |

(Continued)

FOREIGN PATENT DOCUMENTS

| DE | 10156728 | 6/2003 | |
| DE | 10156728 A1 * | 6/2003 | ............. G11C 7/062 |

(Continued)

OTHER PUBLICATIONS

Office Action dated Feb. 12, 2019 from corresponding application No. DE 10-2018-107891.9.

(Continued)

*Primary Examiner* — Mushfique Siddique
(74) *Attorney, Agent, or Firm* — Hauptman Ham, LLP

(57) ABSTRACT

A memory circuit includes a reference node configured to carry a reference voltage having a reference voltage level, a power supply node configured to carry a power supply voltage having a power supply voltage level, a bit line coupled with a plurality of memory cells, a write circuit configured to charge the bit line by driving a voltage level on the bit line toward the power supply voltage level with a first current, and a switching circuit coupled between the power supply node and the bit line. The switching circuit is configured to receive the voltage level on the bit line, and responsive to a difference between the voltage level received on the bit line and the power supply voltage level being less than or equal to a threshold value, drive the voltage level on the bit line toward the power supply voltage level with a second current.

20 Claims, 7 Drawing Sheets

(51) Int. Cl.
*G11C 11/4094* (2006.01)
*G11C 11/412* (2006.01)
*G11C 11/4074* (2006.01)
*G11C 11/419* (2006.01)

(52) U.S. Cl.
CPC ......... *G11C 11/4094* (2013.01); *G11C 11/412* (2013.01); *G11C 11/419* (2013.01)

(56) References Cited

U.S. PATENT DOCUMENTS

| | | | |
|---|---|---|---|
| 5,815,452 A | 9/1998 | Shen | |
| 6,362,661 B1 | 3/2002 | Park | |
| 6,535,026 B2 | 3/2003 | Chung et al. | |
| 6,724,672 B2 | 4/2004 | Nirschl | |
| 7,894,236 B2* | 2/2011 | Oh | G11C 13/0026 365/148 |
| 8,300,491 B2 | 10/2012 | Tao et al. | |
| 8,760,948 B2 | 6/2014 | Tao et al. | |
| 9,007,815 B2 | 4/2015 | Liaw | |
| 10,515,702 B2 | 12/2019 | Jeong | |
| 2003/0112680 A1 | 6/2003 | Nirschl | |
| 2006/0158943 A1 | 7/2006 | Park et al. | |
| 2006/0274587 A1 | 12/2006 | Houston | |
| 2007/0081407 A1* | 4/2007 | Maki | G11C 11/419 365/226 |
| 2008/0158972 A1 | 7/2008 | Pan et al. | |
| 2011/0280088 A1 | 11/2011 | Adams et al. | |
| 2012/0014172 A1* | 1/2012 | Jung | G11C 11/413 365/189.16 |
| 2014/0126278 A1* | 5/2014 | Nii | G11C 11/419 365/154 |
| 2014/0233330 A1 | 8/2014 | Ko et al. | |
| 2014/0293722 A1 | 10/2014 | Aoyagi | |
| 2016/0111143 A1* | 4/2016 | Lin | G11C 11/419 365/156 |
| 2016/0240245 A1 | 8/2016 | Yang et al. | |
| 2018/0096720 A1 | 4/2018 | Aggarwal et al. | |
| 2019/0341101 A1 | 11/2019 | Su | |

FOREIGN PATENT DOCUMENTS

| | | | | |
|---|---|---|---|---|
| DE | 10162260 | | 7/2003 | |
| EP | 1624462 | | 2/2006 | |
| KR | 20010001972 | | 1/2001 | |
| KR | 100672170 | | 1/2007 | |
| KR | 20190113488 A | * | 10/2019 | ........... G11C 7/1096 |

OTHER PUBLICATIONS

Office Action dated Feb. 26, 2019 from corresponding application No. TW 107127972.
Office Action dated Oct. 9, 2020 from corresponding application No. CN 2020092802119000; pp. 1-17.
Notice of Allowance dated Dec. 3, 2020 for corresponding case No. KR 10-2018-0074195. (pp. 1-7).

* cited by examiner

BIT LINE SECONDARY DRIVE CIRCUIT AND METHOD

PRIORITY CLAIM

The present application is a continuation of U.S. application Ser. No. 15/938,393, filed Mar. 28, 2018, which is incorporated herein by reference in its entirety.

BACKGROUND

Memory array data access includes read and write operations having speeds that depend on memory cell type, memory circuit design, parasitic resistance and capacitance levels, operating voltages, and temperature and manufacturing process variations. Overall speed of a system that includes a memory array is sometimes based on memory access speeds.

In many applications, memory circuits are operated at low voltages to limit power consumption and heat generation. As operating voltages decrease, circuit speeds and therefore memory access speeds typically decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
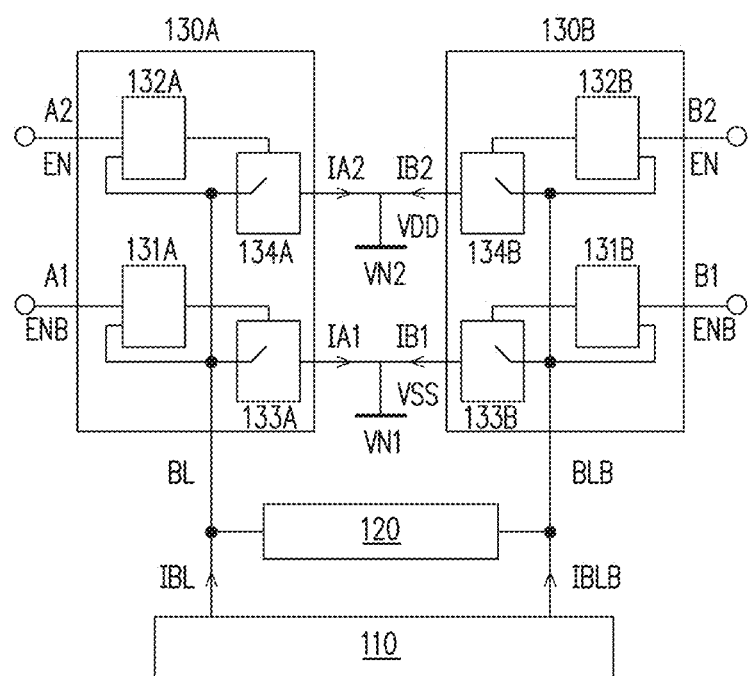
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory circuit includes a switching circuit coupled between a voltage node and a bit line for a plurality of memory cells. The switching circuit includes a logic element that receives a bit line voltage as an input and is capable of causing the bit line to be coupled with the voltage node. During a write, pre-charge, or other operation, a write circuit biases the bit line toward a bias voltage level. As the bit line voltage approaches the bias voltage level, the switching circuit is configured to respond to the bit line voltage by coupling the bit line to the voltage node, thereby increasing the current available for biasing the bit line above a current level provided by the write circuit alone. Compared to approaches that do not increase the available current, the switching circuit causes the bit line to approach the bias voltage level more rapidly, thereby increasing overall operating speed of the memory circuit and enabling a lowered operating voltage for a given operating frequency.

FIG. 1 is a diagram of a memory circuit 100, in accordance with some embodiments. Memory circuit 100 includes a write circuit 110 and a plurality of memory cells 120. Each of write circuit 110 and plurality of memory cells 120 is electrically coupled with a bit line (BL) and with a bit line (hereinafter referred to as a bit line bar (BLB) and having a complementary signal from BL). A switching circuit 130A includes input terminals A1 and A2, and is electrically coupled with bit line BL, a voltage node VN1, and a voltage node VN2. A switching circuit 130B includes input terminals B1 and B2, and is electrically coupled with bit line BLB and voltage nodes VN1 and VN2.

Two or more circuit elements are considered to be electrically coupled based on a direct electrical connection or an electrical connection that includes one or more additional circuit elements and is thereby capable of being controlled, e.g., made resistive or open by a transistor or other switching device.

Memory circuit 100 is a subset of a memory macro, e.g., a memory macro including memory circuit 600A discussed below with respect to FIG. 6A or a memory macro including memory circuit 600B discussed below with respect to FIG. 6B, that includes one or more additional components, e.g., at least one plurality of memory cells (not shown) in addition to plurality of memory cells 120.

Voltage node VN1 is a reference node configured to carry a reference voltage VSS having a reference voltage level of memory circuit 100. In some embodiments, memory circuit 100 is part of a larger system, and the reference voltage level of memory circuit 100 corresponds to a reference voltage level of the system. In some embodiments, memory circuit 100 is part of a larger system, and the reference voltage level of memory circuit 100 corresponds to a memory-specific reference voltage level. In some embodiments, reference voltage VSS is a ground voltage having a ground voltage level.

Voltage node VN2 is a power supply node configured to carry a power supply voltage VDD having a power supply voltage level corresponding to an operational voltage level of memory circuit 100. In some embodiments, memory circuit 100 is part of a larger system, e.g., a system on a chip, and the operational voltage level of memory circuit 100 corresponds to an operational voltage level of the system. In some embodiments, memory circuit 100 is part of a larger system, and the operational voltage level of memory circuit 100 corresponds to a memory-specific operational voltage level.

In some embodiments, the power supply voltage level corresponds to a logically high state and the reference voltage level corresponds to a logically low state.

Write circuit 110 is configured to bias voltage levels on bit lines BL and BLB responsive to one or more control signals (not shown). Write circuit 110 is configured to receive power supply voltage VDD and reference voltage VSS and bias one or both of bit lines BL or BLB toward a bias voltage level corresponding to one of the power supply voltage level or the reference voltage level.

In some embodiments, in a write operation on memory circuit 100, write circuit 110 is configured to bias one of bit lines BL or BLB toward the power supply voltage level and the other of bit lines BL or BLB toward the reference voltage level. In some embodiments, in a read operation on memory circuit 100, write circuit 110 is configured to pre-charge one or both of bit lines BL or BLB by biasing the one or both of bit lines BL or BLB toward either the power supply voltage level or the reference voltage level.

In operation, biasing a bit line, e.g., one of bit lines BL or BLB, toward a voltage level, e.g., one of the power supply or reference voltage levels, includes either causing a bit line voltage level to reach the voltage level or causing the bit line voltage level to approach, but not reach the voltage level.

In operation, biasing bit line BL using write circuit 110 includes driving a voltage level on bit line BL toward the bias voltage level with a current IBL. When the voltage level on bit line BL is lower than the bias voltage level, e.g., the power supply voltage level, current IBL has a positive value. When the voltage level on bit line BL is higher than the bias voltage level, e.g., the reference voltage level, current IBL has a negative value.

In operation, biasing bit line BLB using write circuit 110 includes driving a voltage level on bit line BLB toward the bias voltage level with a current IBLB. When the voltage level on bit line BLB is lower than the bias voltage level, e.g., the power supply voltage level, current IBLB has a positive value. When the voltage level on bit line BLB is higher than the bias voltage level, e.g., the reference voltage level, current IBLB has a negative value.

Bit lines BL and BLB are conductive lines capable of transferring the bias voltage levels to and/or from each memory cell of plurality of memory cells 120, bit lines BL and BLB thereby corresponding to plurality of memory cells 120. Memory circuit 100 is configured so that, in a write operation, bit lines BL and BLB have voltage levels corresponding to complementary logical states.

Plurality of memory cells 120 includes electrical, electromechanical, electromagnetic, or other devices (not individually labeled) configured to store bit data represented by logical states. The logical states of the memory cells in plurality of memory cells 120 are capable of being programmed in a write operation and detected in a read operation.

In some embodiments, a logical state corresponds to a voltage level of an electrical charge stored in a given memory cell. In some embodiments, a logical state corresponds to a physical property, e.g., a resistance or magnetic orientation, of a component of a given memory cell.

In some embodiments, plurality of memory cells 120 includes static random-access memory (SRAM) cells. In various embodiments, SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In some embodiments, plurality of memory cells 120 includes dynamic random-access memory (DRAM) cells or other memory cell types capable of storing bit data.

Plurality of memory cells 120 includes a column of memory cells or a portion of a column of memory cells. In some embodiments, plurality of memory cells 120 includes a number of memory cells ranging from 128 to 1024. In some embodiments, plurality of memory cells 120 includes 256 memory cells. In some embodiments, plurality of memory cells 120 includes 512 memory cells. In some embodiments, plurality of memory cells 120 includes fewer than 128 memory cells. In some embodiments, plurality of memory cells 120 includes greater than 1024 memory cells.

Because a memory macro including memory circuit 100 includes one or more circuits capable of interacting with each memory cell of plurality of memory cells 120, a number of memory cells fewer than 128 reduces the efficiency of the memory macro in some cases.

Because bit lines BL and BLB correspond to plurality of memory cells 120, lengths and resistance values, of bit lines BL and BLB increase as a number of memory cells of plurality of memory cells 120 increases. A number of memory cells greater than 1024 therefore increases the effects of bit line resistance on write and read operations on plurality of memory cells 120.

Switching circuit 130A includes a logic circuit 131A having an input terminal A1 and a logic circuit 132A having an input terminal A2. Each of logic circuits 131A and 132A has an additional input terminal electrically coupled with bit line BL. An output terminal of logic circuit 131A is electrically coupled with a control terminal of a switching device 133A, and an output terminal of logic circuit 132A is electrically coupled with a control terminal of a switching device 134A.

Each of logic circuits 131A and 132A includes one or more logic gates and is configured to generate a switching signal at the output terminal having a voltage level representing a logical state responsive to voltage levels representing logical states received at the input terminals. In various embodiments, logic circuits 131A and 132A include one or more of an inverter, OR gate, NOR gate, AND gate, NAND gate, or other logic gate suitable for applying a logic scheme.

Switching device 133A includes terminals electrically coupled with bit line BL and voltage node VN1, and is configured to electrically connect bit line BL with voltage node VN1 responsive to a voltage level of the switching signal at the control terminal of switching device 133A. Switching device 134A includes terminals electrically coupled with bit line BL and voltage node VN2, and is configured to electrically connect bit line BL with voltage node VN2 responsive to a voltage level of the switching signal at the control terminal of switching device 134A.

Each of switching devices 133A and 134A includes one or more electrical or electro-mechanical constructions capable of making and breaking electrical connections between two or more terminals responsive to voltage levels representing logical states received at the control terminal. In various embodiments, switching devices 133A and 134A include one or more of a transistor, transmission gate, or other device suitable for controlling electrical connections.

In various embodiments, a transistor includes one or a combination of a field-effect transistor (FET), a metal-oxide-semiconductor field-effect transistor (MOSFET), a fin field-effect transistor (FinFET), an n-type transistor, a p-type transistor, a vertical gate transistor, a bipolar or other transistor type.

Logic circuit 131A is configured to cause switching device 133A to electrically couple bit line BL with voltage node VN1 responsive to both the voltage level on bit line BL and the reference voltage level corresponding to a logically low state. In operation, the voltage level on bit line BL corresponding to the logically low state is determined by the difference between the voltage level on bit line BL and the reference voltage level being less than or equal to a threshold value. In some embodiments, the threshold value is determined by a threshold voltage of a transistor in logic circuit 131A.

In operation, the voltage level on bit line BL being equal to or within the threshold value of the reference voltage level corresponds to a first logical state of the switching signal at the output terminal of logic circuit 131A, and the voltage level on bit line BL being above the reference voltage level by more than the threshold value corresponds to a second logical state of the switching signal at the output terminal of logic circuit 131A.

Switching device 133A is configured to, in operation, electrically couple bit line BL with voltage node VN1 in response to the switching signal at the output terminal of logic circuit 131A having the first logical state and to electrically decouple bit line BL from voltage node VN1 in response to the switching signal at the output terminal of logic circuit 131A having the second logical state.

Logic circuit 132A is configured to cause switching device 134A to electrically couple bit line BL with voltage node VN2 responsive to both the voltage level on bit line BL and the power supply voltage level corresponding to a logically high state. In operation, the voltage level on bit line BL corresponding to the logically high state is determined by the difference between the voltage level on bit line BL and the power supply voltage level being less than or equal to a threshold value. In some embodiments, the threshold value is determined by a threshold voltage of a transistor in logic circuit 132A.

In operation, the voltage level on bit line BL being equal to or within the threshold value of the power supply voltage level corresponds to a first logical state of the switching signal at the output terminal of logic circuit 132A, and the voltage level on bit line BL being below the power supply voltage level by more than the threshold value corresponds to a second logical state of the switching signal at the output terminal of logic circuit 132A.

Switching device 134A is configured to, in operation, electrically couple bit line BL with voltage node VN2 in response to the switching signal at the output terminal of logic circuit 132A having the first logical state and to electrically decouple bit line BL from voltage node VN2 in response to the switching signal at the output terminal of logic circuit 132A having the second logical state.

In some embodiments, in operation, bit line BL has an initial voltage level corresponding to a first logical state, and write circuit 110 drives the voltage level on bit line BL toward a bias voltage level corresponding to a second logical state different from the first logical state. Switching circuit 130A is configured to respond to the initial voltage level on bit line BL by maintaining bit line BL electrically decoupled from voltage node VN1 or VN2 carrying the bias voltage level, and to respond to the voltage level on bit line BL approaching the bias voltage level by electrically coupling bit line BL to the voltage node VN1 or VN2 carrying the bias voltage level.

In a discharging operation, logic circuit 131A electrically couples bit line BL with voltage node VN1 responsive to the voltage level on bit line BL approaching the reference voltage level, and a current IA1 flows from bit line BL to voltage node VN1 through switching device 133A until such time as the voltage level on bit line BL is equal to the reference voltage level. In the discharging operation, current IA1 provided by switching circuit 130A is added to the (negative) current IBL provided by write circuit 110 as discussed above, thereby increasing the total current available to drive bit line BL toward the reference voltage level compared to approaches that do not add a current to a write circuit current.

In a charging operation, logic circuit 132A electrically couples bit line BL with voltage node VN2 responsive to the voltage level on bit line BL approaching the power supply voltage level, and a current IA2 flows from voltage node VN2 to bit line BL until such time as the voltage level on bit line BL is equal to the power supply voltage level. In the charging operation, current IA2 provided by switching circuit 130A is added to the (positive) current IBL provided by write circuit 110 as discussed above, thereby increasing the total current available to drive bit line BL toward the power supply voltage level compared to approaches that do not add a current to a write circuit current.

By increasing the discharging and charging currents, in operation, memory circuit 100 including switching circuit 130A increases speeds at which bit line BL is biased toward bias voltage levels compared to approaches that do not add a current to a write circuit current.

By being configured to electrically couple bit line BL with one of voltage nodes VN1 or VN2 responsive to the voltage level on bit line BL, switching circuit 130A is effectively self-triggered in operation, thereby avoiding the need for timing schemes and circuits used by other approaches to increase bit line currents above write circuit currents. Compared to approaches that include timing schemes and circuits, memory circuit 100 including switching circuit 130A is less complex, occupies less space, and uses less power in some cases.

Switching circuit 130A is configured to receive an enable signal ENB on input terminal A1 and an enable signal EN on input terminal A2. Logic circuit 131A is thereby configured to couple bit line BL with voltage node VN1 responsive to the voltage level on bit line BL only when the voltage level of enable signal ENB corresponds to a first logical state. Logic circuit 132A is thereby configured to couple bit line BL with voltage node VN2 responsive to the voltage level on bit line BL only when the voltage level of enable signal EN corresponds to a second logical state.

In some embodiments, one of the first logical state or the second logical state is a logically low state and the other of the first logical state or the second logical state is a logically high state. In some embodiments, enable signals EN and ENB are complementary signals such that when the voltage level of one of enable signals EN or ENB corresponds to one of a logically low or high state, the voltage level of the other of enable signals EN or ENB corresponds to the other of the logically low or high state.

In some embodiments in which enable signals EN and ENB are complementary signals, switching circuit 130A is configured to couple bit line BL with either one of voltage nodes VN1 or VN2 responsive to the voltage levels on bit lines BL when the voltage levels of enable signals ENB and EN correspond to respective first and second logical states and to disable coupling bit line BL with either one of voltage nodes VN1 or VN2 responsive to the voltage level on bit line BL when the voltage levels of enable signals ENB and EN correspond to respective second and first logical states.

In some embodiments, switching circuit 130A does not include input terminal A1, logic circuit 131A, and switching device 133A, and is thereby configured to electrically couple bit line BL with voltage node VN2 without being configured to electrically couple bit line BL with voltage node VN1. In some embodiments, switching circuit 130A does not include input terminal A2, logic circuit 132A, and switching device 134A, and is thereby configured to electrically couple bit line BL with voltage node VN1 without being configured to electrically couple bit line BL with voltage node VN2.

In some embodiments, switching circuit 130A includes one or more input terminals (not shown) in addition to input terminals A1 and/or A2, and switching circuit 130A is configured to electrically couple bit line BL with one or both of voltage nodes VN1 or VN2 further responsive to one or more signals received on the one or more additional input terminals.

Switching circuit 130B includes a logic circuit 131B having an input terminal B1 and a logic circuit 132B having an input terminal B2. Each of logic circuits 131B and 132B has an additional input terminal electrically coupled with bit line BLB. An output terminal of logic circuit 131B is electrically coupled with a control terminal of a switching device 133B, and an output terminal of logic circuit 132B is electrically coupled with a control terminal of a switching device 134B.

Switching circuit 130B is configured to receive enable signal ENB on input terminal B1 and enable signal EN on input terminal B2. Switching circuit 130B is configured to electrically couple bit line BLB with voltage nodes VN1 and VN2 responsive to voltage levels of enable signals ENB and EN and the voltage level on bit line BLB in a manner analogous to that discussed above for switching circuit 130A. Switching circuit 130B is thereby capable of realizing the benefits discussed above with respect to switching circuit 130A.

In the embodiment depicted in FIG. 1, switching circuits 130A and 130B are separate circuits. In some embodiments, memory circuit 100 includes a single switching circuit, e.g., switching circuit 430 discussed below with respect to FIG. 4, configured to electrically couple each of bit lines BL and BLB to one or both of voltage nodes VN1 or VN2 responsive to voltage levels on bit lines BL and BLB.

Figure 2A:
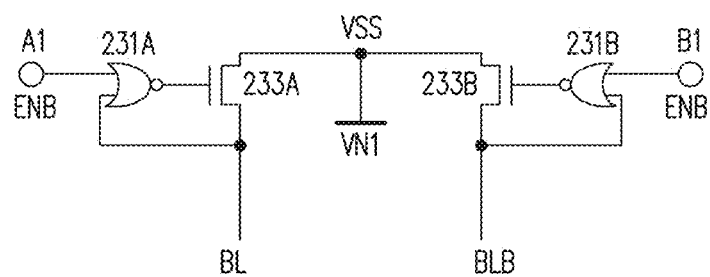
FIG. 2A is a diagram of a memory circuit, in accordance with some embodiments.

FIG. 2A is a diagram of a memory circuit 200, in accordance with some embodiments. Memory circuit 200 is usable as a portion of memory circuit 100, discussed above with respect to FIG. 1. Memory circuit 200 includes bit lines BL and BLB, input terminals A1 and B1, and voltage node VN1, each discussed above with respect to FIG. 1. Memory circuit 200 also includes NOR gate 231A usable as logic circuit 131A, NMOS transistor 233A usable as switching device 133A, NOR gate 231B usable as logic circuit 131B, and NMOS transistor 233B usable as switching device 133B, each discussed above with respect to FIG. 1. Gates of NMOS transistors 233A and 233B correspond to respective control terminals of switching devices 133A and 133B.

In operation, in response to a logically high state of enable signal ENB at input terminals A1 and B1, NOR gates 231A and 231B output switching signals having logically low states for any voltage level on bit lines BL and BLB. In response to having logically low gate voltage levels, NMOS transistors 233A and 233B are switched off, thereby electrically decoupling bit lines BL and BLB from voltage node VN1.

In operation, in response to a logically low state of enable signal ENB at input terminals A1 and B1, NOR gates 231A and 231B output switching signals having logical states responsive to respective voltage levels on bit lines BL and BLB. In response to a logically low bit line BL or BLB voltage level, the corresponding NOR gate 231A or 231B outputs a switching signal having a logically high voltage level, thereby causing the corresponding NMOS transistor 233A or 233B to switch on and electrically couple bit line BL or BLB to voltage node VN1. In response to a logically high bit line BL or BLB voltage level, the corresponding NOR gate 231A or 231B outputs a switching signal having a logically low voltage level, thereby causing the corresponding NMOS transistor 233A or 233B to switch off and electrically decouple the bit line BL or BLB from voltage node VN1.

Figure 2B:
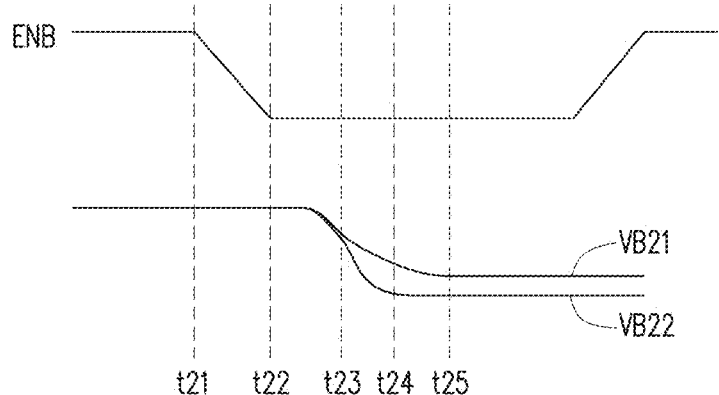
FIG. 2B is a plot of memory circuit operating parameters, in accordance with some embodiments.

FIG. 2B is a plot of memory circuit 200 operating parameters, in accordance with some embodiments. FIG. 2B depicts enable signal ENB and two bit line voltages VB21 and VB22 as a function of time. Bit line voltage VB21 represents a voltage level on either of bit lines BL or BLB driven only by a write circuit, e.g., write circuit 110 discussed above with respect to FIG. 1. Bit line voltage VB22 represents a voltage level on either of bit lines BL or BLB driven by write circuit 110 in combination with NOR gate 231A and NMOS transistor 233A or NOR gate 231B and NMOS transistor 233B.

From times t21 to t22, enable signal ENB transitions from a logically high state to a logically low state. Between times t22 and t23, write circuit 110 drives voltages VB21 and VB22 toward reference voltage level VSS.

In the embodiment depicted in FIG. 2B, enable signal ENB transitions from the logically high state to the logically low state before write circuit 110 starts to drive voltages VB21 and VB22 toward reference voltage level VSS, thereby operating as a gating signal. In some embodiments, enable signal ENB transitions from the logically high state to the logically low state concurrently with write circuit 110 starting to drive voltages VB21 and VB22 toward reference voltage level VSS.

At time t23, in response to voltage VB22 being above reference voltage VSS by within a threshold value corresponding to a threshold voltage of a transistor of NOR gate 231A or 231B, NOR gate 231A or 231B outputs a switching signal that causes corresponding NMOS transistor 233A or 233B to switch on, thereby electrically coupling the corresponding bit line BL or BLB to voltage node VN1 and increasing the discharging current.

As a result of the increased discharging current, voltage VB22 reaches a minimum value at time t24, before voltage VB21 reaches a minimum value at time t25. In the embodiment depicted in FIG. 2B, voltage VB22 also reaches a lower minimum value than the minimum value of voltage VB21 based on the increased discharging current reducing a voltage drop caused by a resistance of bit line BL or BLB.

Memory circuit 200, configured as discussed above, is thereby capable of realizing the benefits discussed above with respect to memory circuit 100 and FIG. 1. Memory circuit 200 is used for the purpose of illustration. Other circuits being otherwise configured to perform the operations discussed above with respect to memory circuits 100 and 200 are within the scope of the disclosure.

Figure 3A:
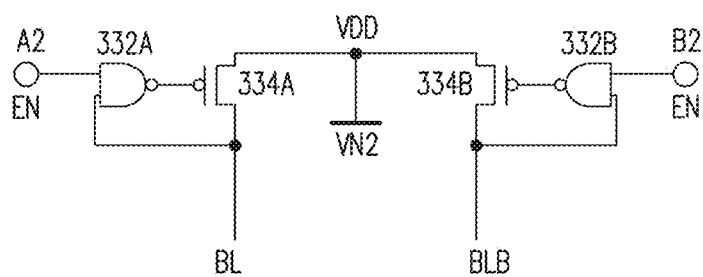
FIG. 3A is a diagram of a memory circuit, in accordance with some embodiments.

FIG. 3A is a diagram of a memory circuit 300, in accordance with some embodiments. Memory circuit 300 is usable as a portion of memory circuit 100, discussed above with respect to FIG. 1. Memory circuit 300 includes bit lines BL and BLB, input terminals A2 and B2, and voltage node VN2, each discussed above with respect to FIG. 1. Memory circuit 300 also includes NAND gate 332A usable as logic circuit 132A, PMOS transistor 334A usable as switching device 134A, NAND gate 332B usable as logic circuit 132B, and PMOS transistor 334B usable as switching device 134B, each discussed above with respect to FIG. 1. Gates of PMOS transistors 334A and 334B correspond to respective control terminals of switching devices 134A and 134B.

In operation, in response to a logically low state of enable signal EN at input terminals A2 and B2, NAND gates 332A and 332B output switching signals having logically high states for any voltage level on bit lines BL and BLB. In response to having logically high gate voltage levels, PMOS transistors 334A and 334B are switched off, thereby electrically decoupling bit lines BL and BLB from voltage node VN2.

In operation, in response to a logically high state of enable signal EN at input terminals A2 and B2, NAND gates 332A and 332B output switching signals having logical states responsive to respective voltage levels on bit lines BL and BLB. In response to a logically high bit line BL or BLB voltage level, the corresponding NAND gate 332A or 332B outputs a switching signal having a logically low voltage level, thereby causing the corresponding PMOS transistor 334A or 334B to switch on and electrically couple bit line BL or BLB to voltage node VN2. In response to a logically low bit line BL or BLB voltage level, the corresponding NAND gate 332A or 332B outputs a switching signal having a logically high voltage level, thereby causing the corresponding PMOS transistor 334A or 334B to switch off and electrically decouple the bit line BL or BLB from voltage node VN2.

Figure 3B:
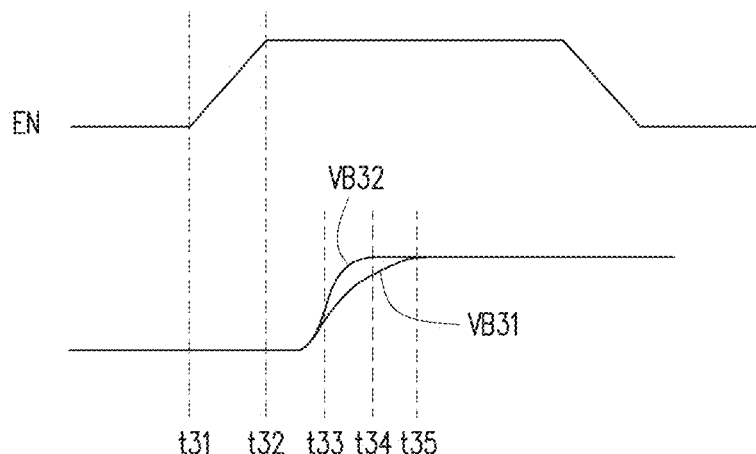
FIG. 3B is a plot of memory circuit operating parameters, in accordance with some embodiments.

FIG. 3B is a plot of memory circuit 300 operating parameters, in accordance with some embodiments. FIG. 3B depicts enable signal EN and two bit line voltages VB31 and VB32 as a function of time. Bit line voltage VB31 represents a voltage level on either of bit lines BL or BLB driven only by a write circuit, e.g., write circuit 110 discussed above with respect to FIG. 1. Bit line voltage VB32 represents a voltage level on either of bit lines BL or BLB driven by write circuit 110 in combination with NAND gate 332A and PMOS transistor 334A or NAND gate 332B and PMOS transistor 334B.

From times t31 to t32, enable signal EN transitions from a logically low state to a logically high state. Between times t32 and t33, write circuit 110 drives voltages VB31 and VB32 toward power supply voltage level VDD.

In the embodiment depicted in FIG. 3B, enable signal EN transitions from the logically low state to the logically high state before write circuit 110 starts to drive voltages VB31 and VB32 toward power supply voltage level VDD, thereby operating as a gating signal. In some embodiments, enable signal EN transitions from the logically low state to the logically high state concurrently with write circuit 110 starting to drive voltages VB31 and VB32 toward power supply voltage level VDD.

At time t33, in response to voltage VB32 being below power supply voltage VDD by within a threshold value corresponding to a threshold voltage of a transistor of NAND gate 332A or 332B, NAND gate 332A or 332B outputs a switching signal that causes corresponding PMOS transistor 334A or 334B to switch on, thereby electrically coupling the corresponding bit line BL or BLB to voltage node VN2 and increasing the charging current.

As a result of the increased charging current, voltage VB32 reaches a maximum value at time t34, before voltage VB31 reaches a maximum value at time t35.

Memory circuit 300, configured as discussed above, is thereby capable of realizing the benefits discussed above with respect to memory circuit 100 and FIG. 1. Memory circuit 300 is used for the purpose of illustration. Other circuits being otherwise configured to perform the operations discussed above with respect to memory circuits 100 and 300 are within the scope of the disclosure.

Figure 4:
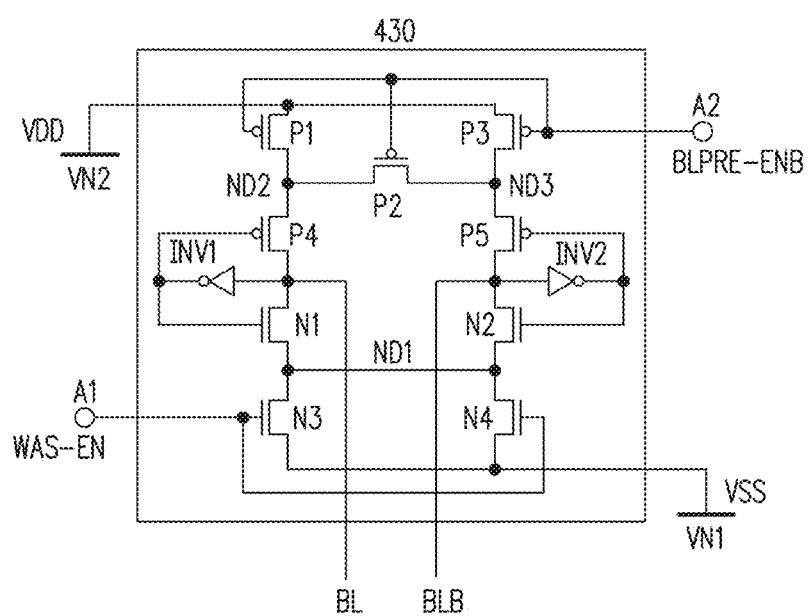
FIG. 4 is a diagram of a memory circuit, in accordance with some embodiments.

FIG. 4 is a diagram of a memory circuit 430, in accordance with some embodiments. Memory circuit 430 is usable as a combination of switching circuits 130A and 130B and includes input terminals A1 and A2, discussed above with respect to FIG. 1. In addition to memory circuit 430, FIG. 4 depicts bit lines BL and BLB and voltage nodes VN1 and VN2, each discussed above with respect to FIG. 1.

In addition to input terminals A1 and A2, memory circuit 430 includes NMOS transistors N1 and N3 coupled in series between bit line BL and voltage node VN1, NMOS transistors N2 and N4 coupled in series between bit line BLB and voltage node VN1, PMOS transistors P1 and P4 coupled in series between bit line BL and voltage node VN2, PMOS transistors P3 and P5 coupled in series between bit line BLB and voltage node VN2. Memory circuit 430 also includes a PMOS transistor P2, and inverters INV1 and INV2.

An input terminal of inverter INV1 is electrically coupled with bit line BL, and an output terminal of inverter INV1 is electrically coupled with gate terminals of NMOS transistor N1 and PMOS transistor P4. An input terminal of inverter INV2 is electrically coupled with bit line BLB, and an output terminal of inverter INV2 is electrically coupled with gate terminals of NMOS transistor N2 and PMOS transistor P5.

Each of NMOS transistors N3 and N4 includes a gate terminal electrically coupled with input terminal A1, which is configured to receive an enable signal WAS-EN. Each of PMOS transistors P1, P2, and P3 includes a gate terminal electrically coupled with input terminal A2, which is configured to receive an enable signal BLPRE-ENB. In some embodiments, enable signals WAS-EN and BLPRE-ENB are complementary signals.

Each of NMOS transistors N1, N2, N3, and N4 includes a source/drain terminal electrically coupled with a node ND1, each of PMOS transistors P1, P2, and P4 includes a source/drain terminal electrically coupled with a node ND2, and each of PMOS transistors P2, P3, and P5 includes a source/drain terminal electrically coupled with a node ND3.

In operation, in response to a logically low state of enable signal WAS-EN at input terminal A1, NMOS transistors N3 and N4 are switched off, thereby electrically decoupling node ND1 from voltage node VN1. With node ND1 electrically decoupled from voltage node VN1, bit line BL is not capable of being electrically coupled with voltage node VN1 when NMOS transistor N1 is switched on so as to electrically couple bit line BL with node ND1, and bit line BLB is not capable of being electrically coupled with voltage node VN1 when NMOS transistor N2 is switched on so as to electrically couple bit line BLB with node ND1.

In operation, in response to a logically high state of enable signal WAS-EN at input terminal A1, NMOS transistors N3 and N4 are switched on, thereby electrically coupling node ND1 with voltage node VN1. In response to a logically low bit line BL voltage level, inverter INV1 outputs a logically high voltage level to the gate of NMOS transistor N1, thereby causing NMOS transistor N1 to switch on and electrically couple bit line BL with node ND1 and voltage node VN1. In response to a logically low bit line BLB voltage level, inverter INV2 outputs a logically high voltage level to the gate of NMOS transistor N2, thereby causing NMOS transistor N2 to switch on and electrically couple bit line BLB with node ND1 and voltage node VN1.

In operation, in response to a logically high state of enable signal BLPRE-ENB at input terminal A2, PMOS transistors P1, P2, and P3 are switched off, thereby electrically decoupling nodes ND2 and ND3 from voltage node VN2. With nodes ND2 and ND3 electrically decoupled from voltage node VN2, bit line BL is not capable of being electrically coupled with voltage node VN2 when PMOS transistor P4 is switched on so as to electrically couple bit line BL with node ND2, and bit line BLB is not capable of being electrically coupled with voltage node VN2 when PMOS transistor P5 is switched on so as to electrically couple bit line BLB with node ND3.

In operation, in response to a logically low state of enable signal BLPRE-ENB at input terminal A2, PMOS transistors P1, P2, and P3 are switched on, thereby electrically coupling nodes ND2 and ND3 with voltage node VN2. In response to a logically high bit line BL voltage level, inverter INV1 outputs a logically low voltage level to the gate of PMOS transistor P4, thereby causing PMOS transistor P4 to switch on and electrically couple bit line BL with node ND2 and voltage node VN2. In response to a logically high bit line BLB voltage level, inverter INV2 outputs a logically low voltage level to the gate of PMOS transistor P5, thereby causing PMOS transistor P5 to switch on and electrically couple bit line BLB with node ND3 and voltage node VN2.

Memory circuit 430 is thereby configured to electrically couple bit line BL with voltage node VN1 responsive to enable signal WAS-EN and the voltage level on bit line BL, electrically couple bit line BLB with voltage node VN1 responsive to enable signal WAS-EN and the voltage level on bit line BLB, electrically couple bit line BL with voltage node VN2 responsive to enable signal BLPRE-ENB and the voltage level on bit line BL, and electrically couple bit line BLB with voltage node VN2 responsive to enable signal BLPRE-ENB and the voltage level on bit line BLB.

Memory circuit 430, by the configuration discussed above, is capable of realizing the benefits discussed above with respect to memory circuit 100 and FIG. 1.

Figure 5:
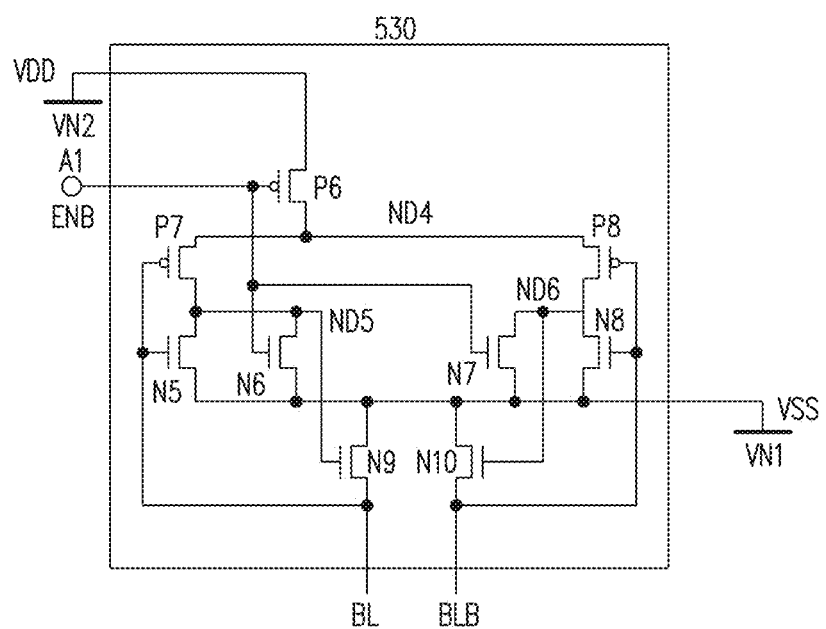
FIG. 5 is a diagram of a memory circuit, in accordance with some embodiments.

FIG. 5 is a diagram of a memory circuit 530, in accordance with some embodiments. Memory circuit 530 is usable as a combination of switching circuits 130A and 130B and includes input terminal A1, discussed above with respect to FIG. 1. In addition to memory circuit 530, FIG. 5 depicts bit lines BL and BLB and voltage nodes VN1 and VN2, each discussed above with respect to FIG. 1.

In addition to input terminal A1, memory circuit 530 includes a PMOS transistor P6 coupled between voltage node VN2 and a node ND4, a PMOS transistor P7 and an NMOS transistor N5 coupled in series between node ND4 and voltage node VN1, and a PMOS transistor P8 and an NMOS transistor N8 coupled in series between node ND4 and voltage node VN1.

Each of PMOS transistor P7 and NMOS transistor N5 includes a gate terminal electrically coupled with bit line BL, and a source/drain terminal electrically coupled with a node ND5. PMOS transistor P7 and NMOS transistor N5 are thereby configured as an inverter having an input terminal electrically coupled with bit line BL and an output terminal electrically coupled with node ND5. An NMOS transistor N9 includes a gate terminal electrically coupled with node ND5 and is coupled between bit line BL and voltage node VN1, thereby being usable as switching device 133A discussed above with respect to switching circuit 130A and FIG. 1.

Each of PMOS transistor P8 and NMOS transistor N8 includes a gate terminal electrically coupled with bit line BLB, and a source/drain terminal electrically coupled with a node ND6. PMOS transistor P8 and NMOS transistor N8 are thereby configured as an inverter having an input terminal electrically coupled with bit line BLB and an output terminal electrically coupled with node ND6. An NMOS transistor N10 includes a gate terminal electrically coupled with node ND6 and is coupled between bit line BLB and voltage node VN1, thereby being usable as switching device 133B discussed above with respect to switching circuit 130B and FIG. 1.

An NMOS transistor N6 is coupled between node ND5 and voltage node VN1, and an NMOS transistor N7 is coupled between node ND6 and voltage node VN1. Each of PMOS transistor P6 and NMOS transistors N6 and N7 includes a gate terminal electrically coupled with input terminal A1 configured to receive enable signal ENB.

In operation, in response to a logically high state of enable signal ENB at input terminal A1, PMOS transistor P6 switches off, thereby electrically decoupling node ND4 from voltage node VN2. In response to the logically high state of enable signal ENB at input terminal A1, each of NMOS transistors N6 and N7 switches on, thereby electrically coupling each of nodes ND5 and ND6 with voltage node VN1 and providing a logically low state at the gate terminals of NMOS transistors N9 and N10.

In operation, in response to the logically low states at the gate terminals, NMOS transistors N9 and N10 switch off, thereby electrically decoupling bit lines BL and BLB from voltage node VN1. With node ND4 electrically decoupled from voltage node VN2 and each of transistors N6 and N7 switched on, bit lines BL and BLB are not capable of being electrically coupled with voltage node VN1 in response to the logically high state of enable signal ENB.

In operation, in response to a logically low state of enable signal ENB at input terminal A1, PMOS transistor P6 switches on, thereby electrically coupling node ND4 with voltage node VN2, and each of NMOS transistors N6 and N7 switches off, thereby electrically decoupling each of nodes ND5 and ND6 from voltage node VN1. The inverter formed by PMOS transistor P7 and NMOS transistor N5 is thereby enabled to control a logical state at the gate terminal of NMOS transistor N9 by outputting a switching signal on node ND5, and the inverter formed by PMOS transistor P8 and NMOS transistor N8 is thereby enabled to control a logical state at the gate terminal of NMOS transistor N10 by outputting a switching signal on node ND6.

In operation, in response to a logically low bit line BL or BLB voltage level, the corresponding inverter outputs the switching signal having a logically high voltage level, thereby causing the corresponding NMOS transistor N9 or N10 to switch on and electrically couple bit line BL or BLB to voltage node VN1. In response to a logically high bit line BL or BLB voltage level, the corresponding inverter outputs the switching signal having a logically low voltage level, thereby causing the corresponding NMOS transistor N9 or N10 to switch off and electrically decouple the bit line BL or BLB from voltage node VN1.

Memory circuit 530, by the configuration discussed above, is capable of realizing the benefits discussed above with respect to memory circuit 100 and FIG. 1.

Figure 6A:
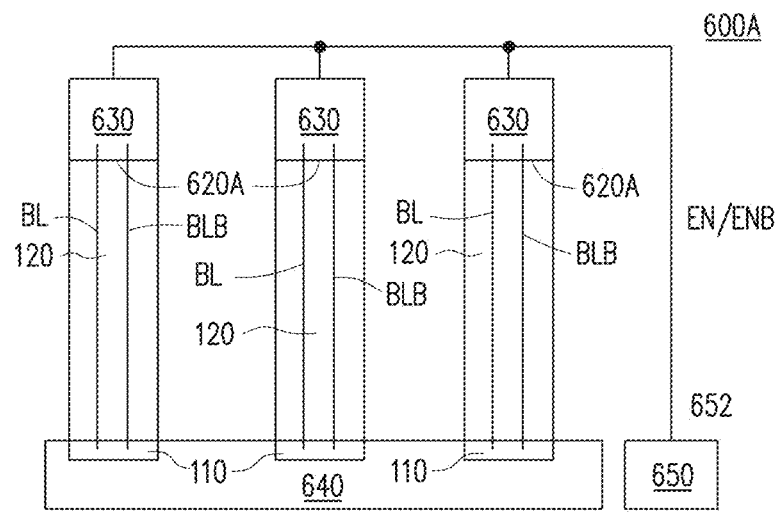
FIG. 6A is a diagram of a memory circuit, in accordance with some embodiments.
Figure 6B:
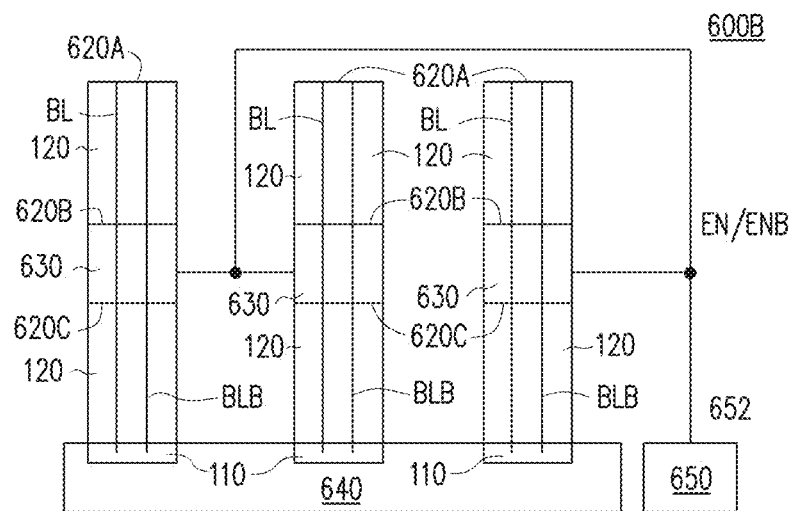
FIG. 6B is a diagram of a memory circuit, in accordance with some embodiments.

FIGS. 6A and 6B are diagrams of respective memory circuits 600A and 600B, in accordance with some embodiments. Each of memory circuits 600A and 600B is a subset of a memory macro and includes a plurality of instances of plurality of memory cells 120, a corresponding plurality of bit lines BL and BLB, a corresponding plurality of write circuits 110, and a corresponding plurality of switching circuits 630 usable as combinations of switching circuits 130A and 130B, each discussed above with respect to memory circuit 100 and FIG. 1.

Memory circuits 600A and 600B differ in the positioning of each switching circuit 630 relative to the corresponding plurality of memory cells 120, as discussed below.

In addition to the plurality of instances of plurality of memory cells 120, bit lines BL and BLB, write circuits 110, and switching circuits 630, each of memory circuits 600A and 600B includes an IO circuit 640 and a control circuit 650. IO circuit 640 is configured to manage input and output operations related to storing and retrieving data to and from the plurality of instances of plurality of memory cells 120, and IO circuit 640 includes the plurality of write circuits 110.

Control circuit 650 is configured to control operations of each of memory circuits 600A and 600B, in part by generating one or both of enable signals EN and ENB, discussed above with respect to memory circuit 100 and FIG. 1, and to output the one or both of enable signals EN and ENB to a bus 652.

Each switching circuit 630 is configured to receive the one or both of enable signals EN and ENB from bus 652, and, responsive to the one or both of enable signals EN and ENB, electrically couple one or both of corresponding bit lines BL or BLB to one or both of voltage nodes VN1 or VN2 further responsive to voltage levels on the corresponding bit lines BL or BLB, as discussed above with respect to FIGS. 1-5.

Each instance of plurality of memory cells 120 has a corresponding cell edge 620A at an end of the plurality of memory cells 120 distal to IO circuit 640. In memory circuit 600A, each switching circuit 630 is located at a corresponding cell edge 620A such that an entirety of the corresponding plurality of memory cells 120 is between the switching circuit 630 and IO circuit 640.

In the embodiment depicted in FIG. 6A, each switching circuit 630 of memory circuit 600A is located at an upper end of a corresponding plurality of memory cells 120. In various embodiments, one or more switching circuits 630 are located at one or more ends of corresponding pluralities of memory cells 120 having other orientations, e.g., a lower, left, or right end of a plurality of memory cells 120.

A given bit line BL or BLB is biased toward a bias voltage by a corresponding write circuit 110 current IBL or IBLB and by a corresponding switching circuit current IA1, IA2, IB1, or IB2, as discussed above with respect to memory circuit 100 and FIG. 1. By the configuration discussed above for memory circuit 600A, the given bit line BL or BLB is biased by a first current at a first end and by a second current at a second end.

Because the given bit line BL or BLB has a resistance distributed along its length, voltage drops along the length caused by current flow are reduced compared to approaches that do not bias a bit line by a first current at a first end and a second current at a second end. Accordingly, bit line voltage levels corresponding to low logical states for a corresponding plurality of memory cells 120 are effectively lower, and bit line voltage levels corresponding to high logical states for a corresponding plurality of memory cells 120 are effectively higher, than voltage levels in approaches that do not bias a bit line by a first current at a first end and a second current at a second end.

In contrast to the configuration of memory circuit 600A, switching circuits 630 in memory circuit 600B are not located at corresponding cell edges 620A. Instead, each plurality of memory cells 120 includes additional cell edges 620B and 620C between cell edge 620A and IO circuit 640, and each switching circuit 630 is located between corresponding cell edges 620B and 620C.

Each cell edge 620C is located at an end of a first portion of a corresponding plurality of memory cells 120 adjacent to IO circuit 640 such that the first portion of the plurality of memory cells 120 is located between cell edge 620C and IO circuit 640.

Each cell edge 620B is located at an end of a second portion of the corresponding plurality of memory cells 120 such that the second portion of the plurality of memory cells 120 is located between cell edges 620A and 620B, and the first portion of the plurality of memory cells 120 is located between IO circuit 640 and the second portion of the plurality of memory cells 120.

In some embodiments, each of the first and second portions of a plurality of memory cells 120 has an equal number of memory cells. In some embodiments, one of the first or second portions of a plurality of memory cells 120 has a number of memory cells greater than a number of memory cells of the other of the first or second portions of the plurality of memory cells 120.

In the embodiment depicted in FIG. 6B, each switching circuit 630 of memory circuit 600B is located in a corresponding plurality of memory cells 120 extending upward. In various embodiments, one or more switching circuits 630 are located in one or more corresponding pluralities of memory cells 120 extending in other directions, e.g., downward, leftward, or rightward.

By the configuration discussed above for memory circuit 600B, a given bit line BL or BLB is biased by a first current at a first end and by a second current at a second location away from the first end.

Because the given bit line BL or BLB has a resistance distributed along its length, voltage drops along the length caused by current flow are reduced compared to approaches that do not bias a bit line by a first current at a first end and a second current at a second location away from the first end. Accordingly, bit line voltage levels corresponding to low logical states for a corresponding plurality of memory cells 120 are effectively lower, and bit line voltage levels corresponding to high logical states for a corresponding plurality of memory cells 120 are effectively higher, than voltage levels in approaches that do not bias a bit line by a first current at a first end and a second current at a second location away from the first end.

Figure 7:
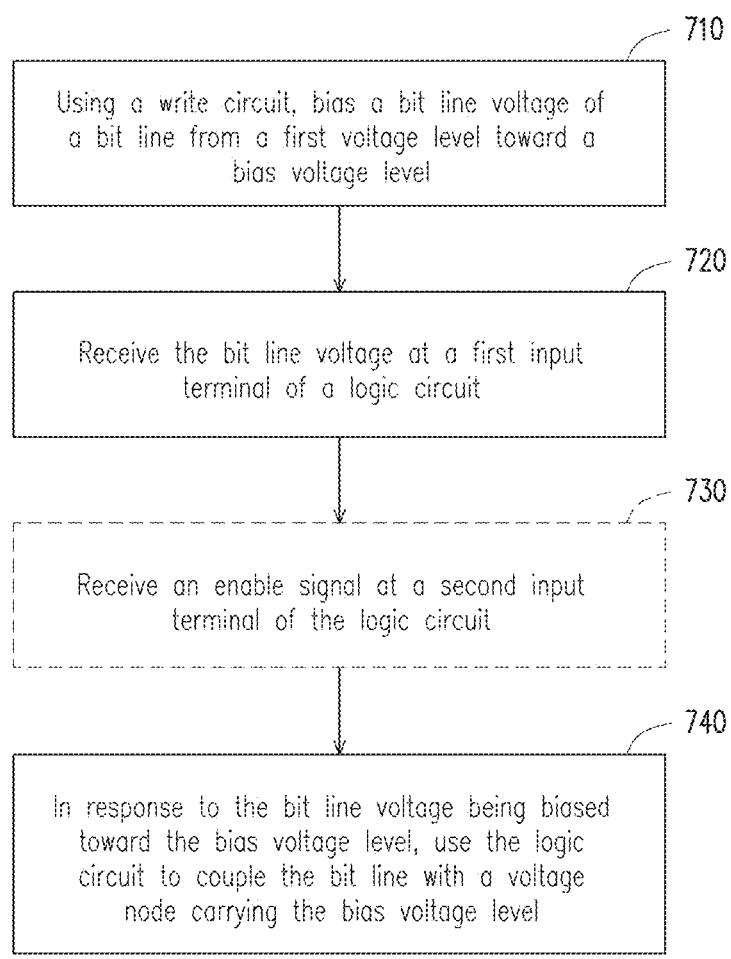
FIG. 7 is a flowchart of a method of biasing a bit line, in accordance with some embodiments.

FIG. 7 is a flowchart of a method 700 of biasing a bit line of a memory circuit, in accordance with one or more embodiments. Method 700 is usable with a memory circuit, e.g., memory circuits 100, 600A, and 600B, discussed above with respect to FIGS. 1, 6A, and 6B.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7. In some embodiments, the operations of method 700 are a subset of operations of a method of operating a memory circuit.

At operation 710, using a write circuit, a bit line voltage of the bit line is biased from a first voltage level toward a bias voltage level. Using the write circuit includes the write circuit providing a positive current to charge the bit line or providing a negative current to discharge the bit line. In some embodiments, using the write circuit includes providing one of currents IBL or IBLB, discussed above with respect to memory circuit 100 and FIG. 1. In some embodiments, using the write circuit includes providing the current at one end of the bit line.

The bit line corresponds to a plurality of memory cells of the memory circuit. In some embodiments, the write circuit is write circuit 110, the bit line is one of bit lines BL or BLB, and the plurality of memory cells is plurality of memory cells 120, each discussed above with respect to memory circuits 100, 600A, and 600B and FIGS. 1, 6A, and 6B.

In some embodiments, biasing the bit line voltage includes biasing the bit line voltage toward a voltage level, e.g., ground or VSS, corresponding to a low logical state. In some embodiments, biasing the bit line voltage includes discharging the bit line as part of a write operation of the memory circuit.

In some embodiments, biasing the bit line voltage includes biasing the bit line voltage toward a voltage level, e.g., VDD, corresponding to a high logical state. In some embodiments, biasing the bit line voltage includes charging the bit line as part of a pre-charge operation of the memory circuit.

At operation 720, the bit line voltage is received at a first input terminal of a logic circuit. Receiving the bit line voltage at the first input terminal includes receiving the bit line voltage at a terminal by which a logical state of the logic circuit is controlled. In some embodiments, receiving the bit line voltage includes receiving the bit line voltage at a gate of a transistor.

In various embodiments, receiving the bit line voltage includes receiving the bit line voltage at the first terminal of the logic circuit having one, two, or more than two input terminals. In some embodiments, receiving the bit line voltage includes receiving the bit line voltage at an input terminal of one or more of logic circuits 131A, 132A, 131B, or 133B, discussed above with respect to memory circuit 100 and FIG. 1.

In various embodiments, receiving the bit line voltage includes receiving the bit line voltage at an input terminal of one of NOR gates 231A or 231B, discussed above with respect to memory circuit 200 and FIGS. 2A and 2B, one of NAND gates 332A or 332B, discussed above with respect to memory circuit 300 and FIGS. 3A and 3B, one of inverters INV1 or INV2, discussed above with respect to memory circuit 430 and FIG. 4, or one of the gate terminals of PMOS transistor P7 and NMOS transistor N5 or the gate terminals of PMOS transistor P8 and NMOS transistor N8, discussed above with respect to memory circuit 530 and FIG. 5.

At operation 730, in some embodiments, an enable signal is received at a second input terminal of the logic circuit. Receiving the enable signal at the second input terminal includes receiving the enable signal at a terminal by which a logical state of the logic circuit is controlled. In some embodiments, receiving the enable signal includes receiving the enable signal at a gate of a transistor.

In some embodiments, receiving the enable signal includes receiving the enable signal having a voltage level corresponding to one of two logical states, and the logic circuit has a first logical state in response to the first of the two logical states, and a second logical state in response to the second of the two logical states.

In various embodiments, receiving the enable signal includes receiving one of enable signals EN, ENB, BLPRE-ENB, or WAS_EN at one or more of input terminals A1, A2, B1, or B2, discussed above with respect to switching circuits 130A and 130B, memory circuits 200, 300, 430, and 530, and FIGS. 1-5.

At operation 740, in response to the bit line voltage being biased toward the bias voltage level, the logic circuit is used to couple the bit line with a voltage node carrying the bias voltage level. Responding to the bit line voltage being biased toward the bias voltage level includes responding to the bit line voltage approaching to within a threshold value of the bias voltage level. In some embodiments, the threshold value is determined by a threshold voltage of a transistor in the logic circuit, and responding to the bit line voltage being biased toward the bias voltage level includes using the transistor to change a logical state of the logic circuit.

Using the logic circuit to couple the bit line with the voltage node carrying the bias voltage level includes causing the bit line to be electrically coupled with the voltage node at a location along the bit line. In some embodiments, the location along the bit line corresponds to cell edge 620A, discussed above with respect to memory circuit 600A and FIG. 6A. In some embodiments, the location along the bit line corresponds to cell edges 620B and 620C, discussed above with respect to memory circuit 600B and FIG. 6B.

In some embodiments, using the logic circuit to couple the bit line with the voltage node carrying the bias voltage level includes coupling one or both of bit lines BL or BLB with one of voltage nodes VN1 or VN2, discussed above with respect to memory circuits 100, 200, 300, 430, and 530, and FIGS. 1-5.

In some embodiments, using the logic circuit to couple the bit line with the voltage node carrying the bias voltage level includes generating a switching signal with the logic circuit, and, in response to a logical state of the switching signal, closing a switching device coupled between the bit line and the voltage node.

Generating the switching signal includes generating the switching signal having a first voltage level corresponding to a first logical state in response to the bit line voltage being within the threshold value of the bias voltage level, and having a second voltage level corresponding to a second logical state in response to the bit line voltage being above or below the bias voltage level beyond the threshold value.

Closing the switching device in response to the switching signal includes closing the switching device in response to the switching signal transitioning from one of the first voltage level to the second voltage level or the second voltage level to the first voltage level.

In various embodiments, closing the switching device includes closing one of switching devices 133A, 134A, 133B, or 134B, discussed above with respect to memory circuit 100 and FIG. 1, or switching on one of NMOS transistors 233A or 233B, discussed above with respect to memory circuit 200 and FIGS. 2A and 2B, PMOS transistors 334A or 334B discussed above with respect to memory circuit 300 and FIGS. 3A and 3B, NMOS transistors N1 or N2, discussed above with respect to memory circuit 430 and FIG. 4, or NMOS transistors N9 or N10, discussed above with respect to memory circuit 530 and FIG. 5.

In some embodiments, using the logic circuit to couple the bit line with the voltage node carrying the bias voltage level is further in response to the enable signal received at the second input terminal of the logic circuit. In some embodiments, using the logic circuit to couple the bit line with the voltage node in response to the enable signal includes the logic circuit transitioning from a first logical state to a second logical state in response to the enable signal.

In some embodiments, using the logic circuit to couple the bit line with the voltage node in response to the enable signal includes the logic circuit generating the switching signal having a voltage level corresponding to a logical state based on the enable signal.

In some embodiments, the switching device is a first switching device coupled between the bit line and the voltage node, and using the logic circuit to couple the bit line with the voltage node in response to the enable signal includes closing a second switching device coupled between the bit line and the voltage node in response to the enable signal.

In some embodiments, using the logic circuit to couple the bit line with the voltage node in response to the enable signal includes turning on one of PMOS transistors P1, P2, or P3 or NMOS transistors N3 or N4, discussed above with respect to memory circuit 430 and FIG. 4.

Using the logic circuit to couple the bit line with the voltage node causes a current to flow between the bit line and the voltage node until such time as the voltage level on the bit line is equal to the bias voltage level. In various embodiments, using the logic circuit to couple the bit line with the voltage node causes one or more of currents IA1, IA2, IB1, or IB2 to flow, as discussed above with respect to memory circuit 100 and FIG. 1.

Using the logic circuit to couple the bit line with the voltage node includes coupling the bit line with the voltage node simultaneously with using the write circuit to bias the bit line voltage. Because the bit line voltage is thereby biased toward the bias voltage using the current caused by being coupled with the voltage in addition to the current provided by the write circuit, the bit line is biased toward the bias voltage more rapidly than if the bit line were biased by either current alone.

By executing the operations of method 700, a bit line is biased using a write circuit and a logic circuit so as to increase the operational speed of one or more pluralities of memory cells compared to approaches that do not use the write circuit and logic circuit, thereby obtaining the benefits discussed above with respect to memory circuit 100 and FIG. 1.

In some embodiments, a memory circuit includes a reference node configured to carry a reference voltage having a reference voltage level, a power supply node configured to carry a power supply voltage having a power supply voltage level, a bit line coupled with a plurality of memory cells, a write circuit configured to charge the bit line by driving a voltage level on the bit line toward the power supply voltage level with a first current, and a switching circuit coupled between the power supply node and the bit line, the switching circuit configured to receive the voltage level on the bit line, and responsive to a difference between the voltage level received on the bit line and the power supply voltage level being less than or equal to a threshold value, drive the voltage level on the bit line toward the power supply voltage level with a second current. In some embodiments, the switching circuit includes a PMOS transistor coupled between the power supply node and the bit line, and a logic circuit including a first input terminal coupled to the bit line, and an output terminal coupled to a gate of the PMOS transistor. In some embodiments, the threshold value is based on a threshold voltage of a transistor in the logic circuit. In some embodiments, the logic circuit includes a NAND gate, the NAND gate comprising the first input terminal and a second input terminal configured to receive an enable signal. In some embodiments, the write circuit is configured to discharge the bit line by driving the voltage level on the bit line toward the reference voltage level with the first current, the threshold value is a first threshold value, and the switching circuit is further coupled between the reference node and the bit line, and is configured to, responsive to a difference between the voltage level received on the bit line and the reference voltage level being less than or equal to a second threshold value, drive the voltage level on the bit line toward the reference voltage level with a third current. In some embodiments, the switching circuit includes a first input terminal configured to receive a first enable signal, and a second input terminal configured to receive a second enable signal complementary to the first enable signal, and the switching circuit is configured to drive the voltage level on the bit line toward the power supply voltage level with the second current further responsive to the first enable signal, and drive the voltage level on the bit line toward the reference voltage level with the third current further responsive to the second enable signal. In some embodiments, the write circuit is configured to drive the voltage level on the bit line with the first current from a first end of the bit line, and the switching circuit is configured to drive the voltage level on the bit line toward the power supply voltage level with the second current from a second end of the bit line. In some embodiments, the plurality of memory cells includes SRAM cells.

In some embodiments, a method of biasing a bit line of a memory circuit includes using a write circuit, biasing a bit line voltage of the bit line from a first voltage level to within a threshold value of a power supply voltage level by providing a first current, receiving the bit line voltage at an input terminal of a logic circuit while using the write circuit to bias the bit line voltage, and in response to the bit line voltage being biased to within the threshold value of the power supply voltage level, using the logic circuit to provide a second current to the bit line from a power supply node carrying the power supply voltage level. In some embodiments, using the write circuit to bias the bit line voltage of the bit line includes using the write circuit to bias a bit line voltage of a complementary bit line from another first voltage level to within the threshold value of the power supply voltage level by providing a third current. In some embodiments, using the logic circuit to provide the second current to the bit line includes generating a switching signal at an output terminal of the logic circuit, and in response to receiving the switching signal at a gate of a PMOS transistor coupled between the bit line and the power supply node, switching off the PMOS transistor. In some embodiments, generating the switching signal at the output terminal of the logic circuit is in response to receiving an enable signal at another input terminal of the logic circuit. In some embodiments, using the write circuit to bias the bit line voltage of the bit line by providing the first current includes providing the first current at a first end of the bit line, and using the logic circuit to provide the second current to the bit line includes providing the second current at a second end of the bit line. In some embodiments, the method includes, using the write circuit, biasing the bit line voltage of the bit line from a second voltage level to within another threshold value of a reference voltage level by providing the first current, receiving the bit line voltage at an input terminal of another logic circuit while using the write circuit to bias the bit line voltage, and in response to the bit line voltage being biased to within the another threshold value of the reference voltage level, using the another logic circuit to provide a third current to the bit line from a reference node carrying the reference voltage level.

In some embodiments, a memory circuit includes a reference node configured to carry a reference voltage having a reference voltage level, a power supply node configured to carry a power supply voltage having a power supply voltage level, a bit line and a complementary bit line coupled with a plurality of memory cells, a write circuit configured to charge each of the bit line and the complementary bit line by driving a first voltage level on the bit line toward the power supply voltage level with a first current and driving a second voltage level on the complementary bit line toward the power supply voltage level with a second current, a first switching circuit coupled between the power supply node and the bit line and configured to receive the first voltage level on the bit line, and responsive to a difference between the first voltage level and the power supply voltage level being less than or equal to a threshold value, drive the first voltage level on the bit line toward the power supply voltage level with a third current, and a second switching circuit coupled between the power supply node and the complementary bit line and configured to receive the second voltage level on the complementary bit line, and responsive to a difference between the second voltage level and the power supply voltage level being less than or equal to the threshold value, drive the second voltage level on the complementary bit line toward the power supply voltage level with a fourth current. In some embodiments, the first switching circuit is configured to drive the first voltage level on the bit line toward the power supply voltage level responsive to an enable signal, and the second switching circuit is configured to drive the second voltage level on the complementary bit line toward the power supply voltage level responsive to the enable signal. In some embodiments, the memory circuit is a first memory circuit of a plurality of memory circuits, and each memory circuit of the plurality of memory circuits includes a corresponding first switching circuit configured to drive a corresponding first voltage level on a corresponding bit line toward the power supply voltage level responsive to the enable signal, and a corresponding second switching circuit configured to drive a corresponding second voltage level on a corresponding complementary bit line toward the power supply voltage level responsive to the enable signal. In some embodiments, each memory circuit of the plurality of memory circuits includes a corresponding plurality of memory cells coupled with the corresponding bit line and a complementary bit line, and each corresponding plurality of memory cells includes SRAM cells. In some embodiments, each corresponding plurality of memory cells includes a number of memory cells equal to or greater than 512. In some embodiments, the write circuit is configured to discharge the bit line by driving the voltage level on the bit line toward the reference voltage level with the first current, and discharge the complementary bit line by driving the voltage level on the complementary bit line toward the reference voltage level with the second current, the threshold value is a first threshold value, the first switching circuit is further coupled between the reference node and the bit line, and is configured to, responsive to a difference between the voltage level received on the bit line and the reference voltage level being less than or equal to a second threshold value, drive the voltage level on the bit line toward the reference voltage level with a fifth current, and the second switching circuit is further coupled between the reference node and the complementary bit line, and is configured to, responsive to a difference between the voltage level received on the complementary bit line and the reference voltage level being less than or equal to the second threshold value, drive the voltage level on the complementary bit line toward the reference voltage level with a sixth current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a reference node configured to carry a reference voltage having a reference voltage level;
   a power supply node configured to carry a power supply voltage having a power supply voltage level;
   a bit line coupled with a plurality of memory cells;
   a write circuit configured to charge the bit line by driving a voltage level on the bit line toward the power supply voltage level with a first current on a first current path; and
   a switching circuit separate from the write circuit and coupled between the power supply node and the bit line, wherein
   the switching circuit comprises a first input terminal configured to receive a first enable signal,
   the switching circuit is configured to
      receive the voltage level on the bit line, and
      responsive to a logical state of the first enable signal and to a difference between the voltage level received on the bit line and the power supply voltage level being less than or equal to a threshold value, drive the voltage level on the bit line toward the power supply voltage level with a second current on a second current path.

2. The memory circuit of claim 1, wherein the switching circuit comprises:
   a PMOS transistor coupled between the power supply node and the bit line; and
   a logic circuit comprising a first input terminal coupled to the bit line, and an output terminal coupled to a gate of the PMOS transistor.

3. The memory circuit of claim 2, wherein the threshold value is based on a threshold voltage of a transistor in the logic circuit.

4. The memory circuit of claim 2, wherein the logic circuit comprises a NAND gate, the NAND gate comprising the first input terminal and a second input terminal configured to receive the first enable signal.

5. The memory circuit of claim 1, wherein
the write circuit is configured to discharge the bit line by driving the voltage level on the bit line toward the reference voltage level with the first current,
the threshold value is a first threshold value, and
the switching circuit is further coupled between the reference node and the bit line, and is configured to, responsive to a difference between the voltage level received on the bit line and the reference voltage level being less than or equal to a second threshold value, drive the voltage level on the bit line toward the reference voltage level with a third current on a third current path.

6. The memory circuit of claim 5, wherein
the switching circuit further comprises a second input terminal configured to receive a second enable signal complementary to the first enable signal, and
the switching circuit is configured to drive the voltage level on the bit line toward the reference voltage level with the third current further responsive to the second enable signal.

7. The memory circuit of claim 1, wherein
the write circuit is configured to drive the voltage level on the bit line with the first current on the first current path at a first end of the bit line, and
the switching circuit is configured to drive the voltage level on the bit line toward the power supply voltage level with the second current on the second current path at a second end of the bit line.

8. The memory circuit of claim 1, wherein the plurality of memory cells comprises static random-access memory (SRAM) cells.

9. A method of biasing a bit line of a memory circuit, the method comprising:
using a write circuit, biasing a bit line voltage of the bit line from a first voltage level to within a threshold value of a power supply voltage level by providing a first current on a first current path from a power supply node carrying the power supply voltage level;
receiving the bit line voltage at a first input terminal of a logic circuit separate from the write circuit while using the write circuit to bias the bit line voltage;
receiving an enable signal at a second input terminal of the logic circuit; and
in response to a logical state of the enable signal and to the bit line voltage being biased to within the threshold value of the power supply voltage level, using the logic circuit to provide a second current to the bit line on a second current path from the power supply node.

10. The method of claim 9, wherein the using the write circuit to bias the bit line voltage of the bit line comprises using the write circuit to bias a bit line voltage of a complementary bit line from another first voltage level to within the threshold value of the power supply voltage level by providing a third current.

11. The method of claim 9, wherein the using the logic circuit to provide the second current to the bit line comprises:
generating a switching signal at an output terminal of the logic circuit; and
in response to receiving the switching signal at a gate of a PMOS transistor in the second current path between the bit line and the power supply node, switching on the PMOS transistor.

12. The method of claim 11, wherein
the receiving the bit line voltage at the first input terminal of the logic circuit comprises receiving the bit line voltage at a first input terminal of a NAND gate,
the receiving the enable signal at the second input terminal of the logic circuit comprises receiving the enable signal at a second input terminal of the NAND gate, and
the generating the switching signal at the output terminal of the logic circuit comprises generating the switching signal at an output terminal of the NAND gate.

13. The method of claim 9, wherein
the using the write circuit to bias the bit line voltage of the bit line by providing the first current comprises providing the first current on the first current path at a first end of the bit line, and
the using the logic circuit to provide the second current to the bit line comprises providing the second current on the second current path at a second end of the bit line.

14. The method of claim 9, further comprising:
using the write circuit, biasing the bit line voltage of the bit line from a second voltage level to within another threshold value of a reference voltage level by providing the first current;
receiving the bit line voltage at an input terminal of another logic circuit while using the write circuit to bias the bit line voltage; and
in response to the bit line voltage being biased to within the another threshold value of the reference voltage level, using the another logic circuit to provide a third current to the bit line from a reference node carrying the reference voltage level.

15. A memory circuit comprising:
a reference node configured to carry a reference voltage having a reference voltage level;
a power supply node configured to carry a power supply voltage having a power supply voltage level;
a bit line and a complementary bit line coupled with a plurality of memory cells;
a write circuit configured to charge each of the bit line and the complementary bit line by driving a first voltage level on the bit line toward the power supply voltage level with a first current on a first current path and driving a second voltage level on the complementary bit line toward the power supply voltage level with a second current on a second current path;
a first switching circuit separate from the write circuit and coupled between the power supply node and the bit line and comprising a first NAND gate configured to receive the first voltage level on the bit line, and responsive to a difference between the first voltage level and the power supply voltage level being less than or equal to a threshold value, drive the first voltage level on the bit line toward the power supply voltage level with a third current on a third current path; and
a second switching circuit separate from the write circuit and coupled between the power supply node and the complementary bit line and comprising a second NAND gate configured to receive the second voltage level on the complementary bit line, and responsive to a difference between the second voltage level and the power supply voltage level being less than or equal to the threshold value, drive the second voltage level on the complementary bit line toward the power supply voltage level with a fourth current on a fourth current path.

16. The memory circuit of claim 15, wherein
the first switching circuit is configured to drive the first voltage level on the bit line toward the power supply voltage level responsive to an enable signal, and
the second switching circuit is configured to drive the second voltage level on the complementary bit line toward the power supply voltage level responsive to the enable signal.

17. The memory circuit of claim 16, wherein,
the memory circuit is a first memory circuit of a plurality of memory circuits, and
each memory circuit of the plurality of memory circuits comprises:
  a corresponding first switching circuit configured to drive a corresponding first voltage level on a corresponding bit line toward the power supply voltage level responsive to the enable signal; and
  a corresponding second switching circuit configured to drive a corresponding second voltage level on a corresponding complementary bit line toward the power supply voltage level responsive to the enable signal.

18. The memory circuit of claim 17, wherein
each memory circuit of the plurality of memory circuits comprises a corresponding plurality of memory cells coupled with the corresponding bit line and a complementary bit line, and
each corresponding plurality of memory cells comprises static random-access memory (SRAM) cells.

19. The memory circuit of claim 18, wherein each corresponding plurality of memory cells comprises a number of memory cells equal to or greater than 512.

20. The memory circuit of claim 15, wherein
the write circuit is configured to discharge the bit line by driving the voltage level on the bit line toward the reference voltage level with the first current, and discharge the complementary bit line by driving the voltage level on the complementary bit line toward the reference voltage level with the second current,
the threshold value is a first threshold value,
the first switching circuit is further coupled between the reference node and the bit line, and is configured to, responsive to a difference between the voltage level received on the bit line and the reference voltage level being less than or equal to a second threshold value, drive the voltage level on the bit line toward the reference voltage level with a fifth current, and
the second switching circuit is further coupled between the reference node and the complementary bit line, and is configured to, responsive to a difference between the voltage level received on the complementary bit line and the reference voltage level being less than or equal to the second threshold value, drive the voltage level on the complementary bit line toward the reference voltage level with a sixth current.

* * * * *